(12) United States Patent
Hirayama et al.

(10) Patent No.: US 9,939,575 B2
(45) Date of Patent: Apr. 10, 2018

(54) METHOD OF MANUFACTURING LIGHT GUIDE PLATE, LIGHTING DEVICE, AND DISPLAY DEVICE

(71) Applicant: Sharp Kabushiki Kaisha, Osaka-shi, Osaka (JP)

(72) Inventors: Yoshinobu Hirayama, Osaka (JP); Tetsuyuki Takemoto, Osaka (JP); Masaki Kageyama, Yonago (JP); Masanori Ehara, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 295 days.

(21) Appl. No.: 14/778,175

(22) PCT Filed: Feb. 27, 2014

(86) PCT No.: PCT/JP2014/054813
§ 371 (c)(1),
(2) Date: Sep. 18, 2015

(87) PCT Pub. No.: WO2014/148220
PCT Pub. Date: Sep. 25, 2014

(65) Prior Publication Data
US 2016/0282545 A1  Sep. 29, 2016

(30) Foreign Application Priority Data

Mar. 21, 2013  (JP) .................................. 2013-058347

(51) Int. Cl.
*F21V 8/00* (2006.01)
*B29D 11/00* (2006.01)
(Continued)

(52) U.S. Cl.
CPC .......... *G02B 6/0065* (2013.01); *B29C 59/002* (2013.01); *B29C 59/005* (2013.01);
(Continued)

(58) Field of Classification Search
CPC ............................. G02B 6/0065; G02B 6/002; B29D 11/00721; B29C 59/002; B29C 59/022;
(Continued)

(56) References Cited

U.S. PATENT DOCUMENTS 7,976,740 B2 *  7/2011  Jenkins ............ B29D 11/00269
264/1.29
9,027,364 B2 *  5/2015  Asai ...................... C03B 23/037
65/102
2013/0063978 A1 *  3/2013  Gettemy .............. G02B 6/0031
362/609

FOREIGN PATENT DOCUMENTS

JP          2004-082437 A        3/2004

* cited by examiner

*Primary Examiner* — Jun Yoo
(74) *Attorney, Agent, or Firm* — Keating & Bennett, LLP

(57) ABSTRACT

A method of manufacturing a light guide plate includes steps of cutting a light guide plate base material with a frame-shaped die into a die-cut plate 50 including side surfaces each having a rectangular shape and performing thermal-imprinting process. In thermal-imprinting process, a processing surface 60a of a plate surface of a heated processing board 60 is pressed against one of the side surfaces 52 of the die-cut plate 50 to thermally imprint a pattern of the processing surface 60a of the processing board 60 on the one of the side surfaces 52 of the die-cut plate 50. The processing surface 60a having a shape that is recessed more at a portion thereof opposite a middle of a long dimension of the one of the side surfaces 52 than a portion thereof opposite ends of the long dimension of the one of the side surfaces 52 is pressed against the side surface 52.

10 Claims, 16 Drawing Sheets

(51) Int. Cl.
  *G02F 1/1335* (2006.01)
  *B29C 59/00* (2006.01)
  *B29C 59/02* (2006.01)
  *G03F 7/00* (2006.01)
  *B29K 69/00* (2006.01)
  *B29K 105/00* (2006.01)
  *B29L 11/00* (2006.01)

(52) U.S. Cl.
  CPC ...... *B29C 59/022* (2013.01); *B29D 11/00721* (2013.01); *G02B 6/002* (2013.01); *G02F 1/133608* (2013.01); *G03F 7/0002* (2013.01); *B29C 2059/023* (2013.01); *B29K 2069/00* (2013.01); *B29K 2105/256* (2013.01); *B29L 2011/0075* (2013.01); *G02F 2001/133628* (2013.01)

(58) Field of Classification Search
  CPC ............ B29C 59/005; B29C 2059/023; G03F 7/0002; B29L 2011/0075; B29K 2105/256; B29K 2069/00; G02F 2001/133628; G02F 1/133608
  See application file for complete search history.

METHOD OF MANUFACTURING LIGHT GUIDE PLATE, LIGHTING DEVICE, AND DISPLAY DEVICE

TECHNICAL FIELD

The present invention relates to a method of manufacturing a light guide plate, a lighting device, and a display device.

BACKGROUND ART

An example of backlight devices used in liquid crystal display devices is known as an edge-light type backlight device. Such an edge-light type backlight device may include a light guide plate disposed in a case for directing light emitted from a light source toward a display surface. In general, a base material for a light guide plate made of resin is processed by blanking with a frame-shaped die and thus a primary molding member is obtained.

Patent document 1 discloses a method of forming a light guide plate. In this method, a resin plate is extruded to form a primary molding plate for a light guide plate, and a stamper is pressed against a side surface of the primary molding plate. The stamper is a portion of a heated plate and includes a pattern or a flat surface. Therefore, the side surface of the primary molding plate is heated and pressed by the stamper to have the pattern thereon or to be a flat surface.

RELATED ART DOCUMENT

Patent Document

Patent Document 1: Japanese Unexamined Patent Application Publication No. 2004-82437

Problem to be Solved by the Invention

In the method of forming the light guide plate described in Patent document 1, the stamper having a flat surface is pressed against the side surface of the light guide plate. In this configuration, while the stamper is pressing the side surface of the light guide plate, a part of a middle portion of the side surface is pressed out toward edges of the side surface. Accordingly, the part of the side surface may protrude over the edges of the side surface and this may cause burrs at the edges of the side surface.

DISCLOSURE OF THE PRESENT INVENTION

The technology disclosed herein was made in view of the above circumstances. An object is to provide a technology of manufacturing a light guide plate having no or less burrs created at ends of a side surface of the light guide plate and having effective entrance properties of light through the side surface.

Means for Solving the Problem

A method of manufacturing a light guide plate according to the technology described in the specification includes steps of cutting a light guide plate base material with a die having a frame-like shape into a die-cut plate including side surfaces each having a rectangular shape and performing thermal-imprinting process. In the thermal-imprinting process, a processing surface of a plate surface of a heated processing board is pressed against one of the side surfaces of the die-cut plate to thermally imprint a pattern of the processing surface of the processing board to the one of the side surfaces of the die-cut plate. In the thermal-imprinting process, the processing surface having a shape that is recessed more at a portion thereof to be opposite a middle of a long dimension of the one of the side surfaces than a portion thereof to be opposite ends of the long dimension of the one of the side surfaces is pressed against the one of the side surfaces.

According to the above method, in the thermal-imprinting process, the processing surface of the processing board is pressed against the one of the side surfaces of the die-cut plate that is formed by cutting the light guide plate base material. Accordingly, the light guide plate manufactured by the method has the side surface having improved surface accuracy and improved light entering property. If the processing surface of the processing board is flat and the processing surface is pressed against the side surface of the die-cut plate, a middle of the long dimension of the side surface is pressed and pushed toward the ends of the long dimension of the side surface. Thus, the side surface protrudes over the ends. That is, burrs may be created at the ends of the long dimension of the side surface. In contrast, in the above method, the processing surface having the shape that is recessed more at the portion thereof opposite the middle of the long dimension of the side surface is pressed against the side surface of the die-cut plate in the thermal-imprinting process. That is, the die-cut plate is gradually pressed by the processing surface 60a from the ends of the long dimension of the side surface toward the middle. Thus, burrs are not or less likely to be created at the ends of the side surface. As described above, in the above manufacturing method, the light guide plate having an improved light entering property at the side surface is manufactured with less or no burrs at the ends of the side surface.

In the thermal-imprinting process, the processing board may be pressed against the one of the side surfaces of the die-cut plate to be disposed opposite a light source among the side surfaces of the die-cut plate.

According to the manufacturing method, the manufactured light guide plate has aside surface that is to be disposed opposite the light source and having improved surface accuracy. This effectively improves brightness of a backlight unit that includes the light guide plate.

In the thermal-imprinting process, the processing board may be pressed against all of the side surfaces of the die-cut plate.

According to the manufacturing method, all of the side surfaces of the manufactured light guide plate have improved surface accuracy. This further effectively improves brightness of the backlight unit that includes the light guide plate.

In the thermal-imprinting process, the processing board including the processing surface that is a smooth surface formed by mirror finishing may be pressed against the one of the side surfaces.

According to the manufacturing method, the processing surface that is the smooth surface formed by mirror finishing is pressed against the one of the side surfaces. Thus, entrance efficiency of light entering through the side surface improves. This effectively improves brightness of the backlight unit including the light guide plate.

In the thermal-imprinting process, the processing board including the processing surface that is a rough surface may be pressed against the one of the side surfaces.

According to the manufacturing method, the light guide plate including the side surface that is a rough surface having high accuracy is manufactured. By arranging light sources opposite the one of the side surfaces corresponding to the rough surface pattern, uneven brightness does not or is less likely to occur between light sources adjacent to each other.

In the thermal-imprinting process, the pattern of the processing surface may be a micro-fabricated pattern and the processing board including the micro-fabricated pattern may be pressed against the one of the side surfaces.

According to the manufacturing method, the light guide plate including the side surface that is a micro-fabricated surface having high accuracy is manufactured. By arranging light sources opposite the side surface corresponding to the micro-fabricated surface pattern, uneven brightness does not or is less likely to occur between light sources adjacent to each other.

In the thermal-imprinting process, the micro-fabricated pattern of the processing surface may be a wavy pattern along the long dimension of the one of the side surfaces and the processing board including the wavy pattern may be pressed against the one of the side surfaces.

According to the manufacturing method, the light guide plate including the side surface that is a micro-fabricated wavy surface having high accuracy is manufactured. By arranging light sources opposite the one of the side surfaces such that the light sources correspond to convex and concave portions of the micro-fabricated wavy pattern, uneven brightness does not or is less likely to occur between the light sources adjacent to each other.

In the thermal-imprinting process, the processing board may be pressed against the one of the side surfaces while the die-cut plate is held with respect to the long dimension of the one of the side surfaces.

According to the manufacturing method, the die-cut plate is less likely to be displaced in the long dimension in the thermal-imprinting process. Thus, the one of the side surfaces of the die-cut plate is appropriately processed.

The technology described in the specification may be a method of manufacturing a lighting device including steps of manufacturing the light guide plate by the above manufacturing method and disposing a light source opposite the one of the side surfaces of the light guide plate. Further, the technology described in the specification may be a method of manufacturing a display device including steps of manufacturing the lighting device manufactured by the above manufacturing method and disposing a display panel opposite one of plate surfaces of the light guide plate.

Advantageous Effect of the Invention

According to the technology disclosed in this specification, a light guide plate having no or less burrs created at ends of a side surface thereof and having effective entrance properties of light through the side surface is manufactured.

MODE FOR CARRYING OUT THE INVENTION

First Embodiment

Figure 1:
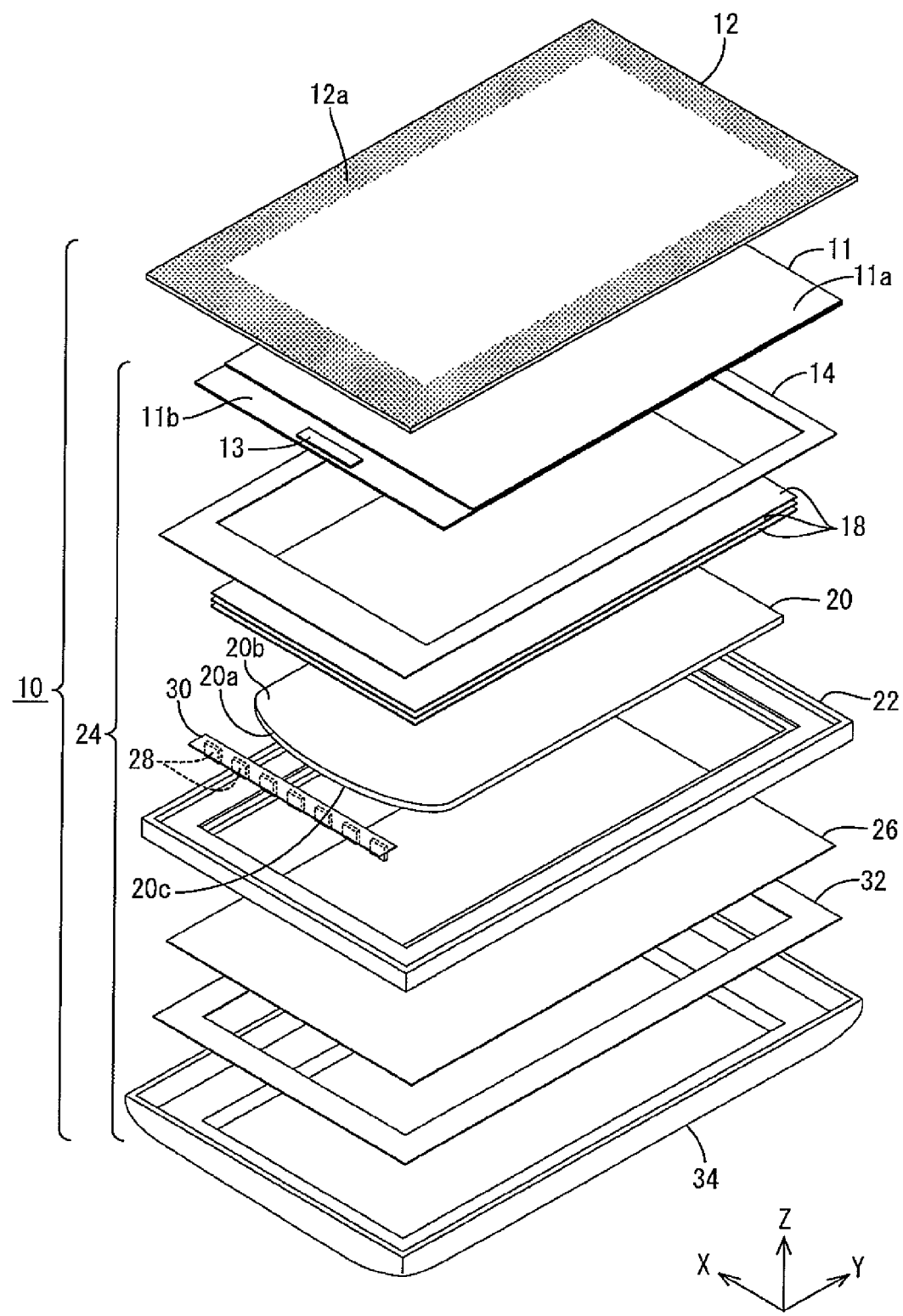
FIG. 1 is an exploded perspective view of a liquid crystal display device according to a first embodiment, illustrating a general configuration of the liquid crystal display device.

A first embodiment will be described with reference to the drawings. A liquid crystal display device (an example of a display device) 10 including a light guide plate 20 will be described in this description. X-axis, Y-axis and Z-axis may be indicated in the drawings. The axes in each drawing correspond to the respective axes in other drawings.

As illustrated in FIG. 1, the liquid crystal display device 10 has a rectangular and vertically long overall shape. The liquid crystal display device 10 includes a liquid crystal panel (an example of a display panel) 11, a cover panel 12, and a backlight unit (an example of a lighting device) 24 as an external light source. The liquid crystal panel 11 includes a front surface configured as a display surface and images are displayed thereon. The cover panel 12 is disposed opposite the display surface of the liquid crystal panel 11. The backlight unit 24 is disposed on a reverse side of the liquid crystal panel 11 from the cover panel 12. The backlight unit 24 is configured to supply light to the liquid crystal panel 11. The liquid crystal display device 10 further includes a casing 34 that holds the cover panel 12, the liquid crystal panel 11, and the backlight unit 24 therein. Applications of the liquid crystal display device 10 according to this embodiment include electronic devices such as mobile information terminals (e.g., mobile phones, smart phones, tablet-type laptop computers), in-vehicle information terminals (e.g., stationary car navigation systems and portable car navigation systems), and portable video game players. The display size of the liquid crystal panel 11 and the size of the cover panel 12 included in the liquid crystal display device 10 are from several inches to a dozen inches. Namely, the liquid crystal panel 11 and the cover panel 12 are generally classified as a small sized or a medium sized panel.

As illustrated in FIG. 1, the liquid crystal panel 11 has a rectangular and vertically long overall shape and includes a pair of transparent glass substrates 11a, 11b (having light transmissivity) and a liquid crystal layer in between the substrates 11a and 11b. The liquid crystal layer contains liquid crystal molecules, which are substances that change optical characteristics when electromagnetic field is applied. The cover panel 12 covers an entire area of the liquid crystal panel 11 from the front to protect the liquid crystal panel 11. The cover panel 12 includes a light blocking portion 12a along a periphery thereof. The light blocking portion 12a blocks light. The casing 34 is made of synthetic resin or metal and shaped into a shallow tray-like shape with an opening on the front, as illustrated in FIG. 1. A casing adhesive tape 32 is between the casing 34 and the frame 22. The casing 34 and the frame 22 are attached with the casing adhesive tape 32.

The backlight unit 24 includes light emitting diode (LEDs) 28, LEDs 28, a flexible board 30, a light guide plate 20, optical sheets 18, a reflection sheet 26, and the frame 22. The LEDs 28 are mounted on the flexible board 30 having flexibility. The light guide plate 20 is configured to direct light emitted from the LEDs 28 toward the liquid crystal panel 11. The optical sheets 18 are placed on the light guide plate 20. The optical sheets 18 are configured such that light from the light guide plate 20 pass through the optical sheets 18 while receiving specific optical effects, and the light exits the optical sheets 18 toward the liquid crystal panel 11. The reflection sheet 26 is placed under the light guide plate 20 to reflect light that leaks from the light guide plate 20. The frame 22 has a frame-like shape and surrounds the light guide plate 20 and the optical sheets 18, and holds the optical sheets 18 and the liquid crystal panel 11 from a rear side (a reverse side from the cover panel 12). A panel adhesive sheet 14 is between the optical sheets 18 and the liquid crystal panel 11. The panel adhesive sheet 14 is a double-sided tape having a frame-like shape. The liquid crystal panel 11 and the optical sheet 18 are attached with the panel adhesive tape 14.

The light guide plate 20 will be described in detail. The light guide plate 20 is made of substantially a transparent (i.e., highly light transmissivity) synthetic resin (e.g. polycarbonate) having a refractive index sufficiently higher than that of the air. As illustrated in FIG. 1, the light guide plate 20 has a rectangular shape in a plan view similar to the liquid crystal panel 11. The light guide plate 20 has a thickness larger than that of each of the optical sheets 18. A long-side direction and a short-side direction of a plate surface of the light guide plate 20 correspond to the X-axis direction and the Y-axis direction, respectively. A thickness direction of the light guide plate 20 that is perpendicular to the plate surface of the light guide plate 20 corresponds to the Z-axis direction. The light guide plate 20 is surrounded by the frame 22 and located directly below the liquid crystal panel 11 and the optical sheets 18. One of the plate surfaces of the light guide plate 20 that faces the front (a surface facing the liquid crystal panel 11 or the optical sheets 18) is configured as a light exit surface 20b through which light inside the light guide plate 20 exits toward the optical sheets 18 and the liquid crystal panel 11. Another one of the plate surfaces of the light guide plate 20 that is on a reversed side (rear surface) from the light exit surface 20b is a reverse surface 20c.

Side surfaces of the light guide plate 20 adjacent to the plate surfaces of the light guide plate 20 include side surfaces extending in the X-axis direction. One of the side surfaces (the left surface in FIG. 1) is a light entering surface 20a that is opposite the LEDs 28 mounted on the flexible board 30. Light emitted from the LEDs 28 enters the light guide plate 20 through the light entering surface 20a. As illustrated in FIG. 1, the light entering surface 20a has an arc-like shape that curves with respect to the X-axis direction. Even with the light entering surface 20a having such an arc-like shape, the light entering surface 20a is configured to pass light emitted from the LEDs 28. The light guide plate 20 is configured to receive light emitted from the LEDs 17 through the light entering surface 20a, transmit the light therethrough, and direct the light toward the optical sheets 18 (the front side, the light exit side) such that the light exits the light guide plate 20 through the light exit surface 20b.

Figure 2:
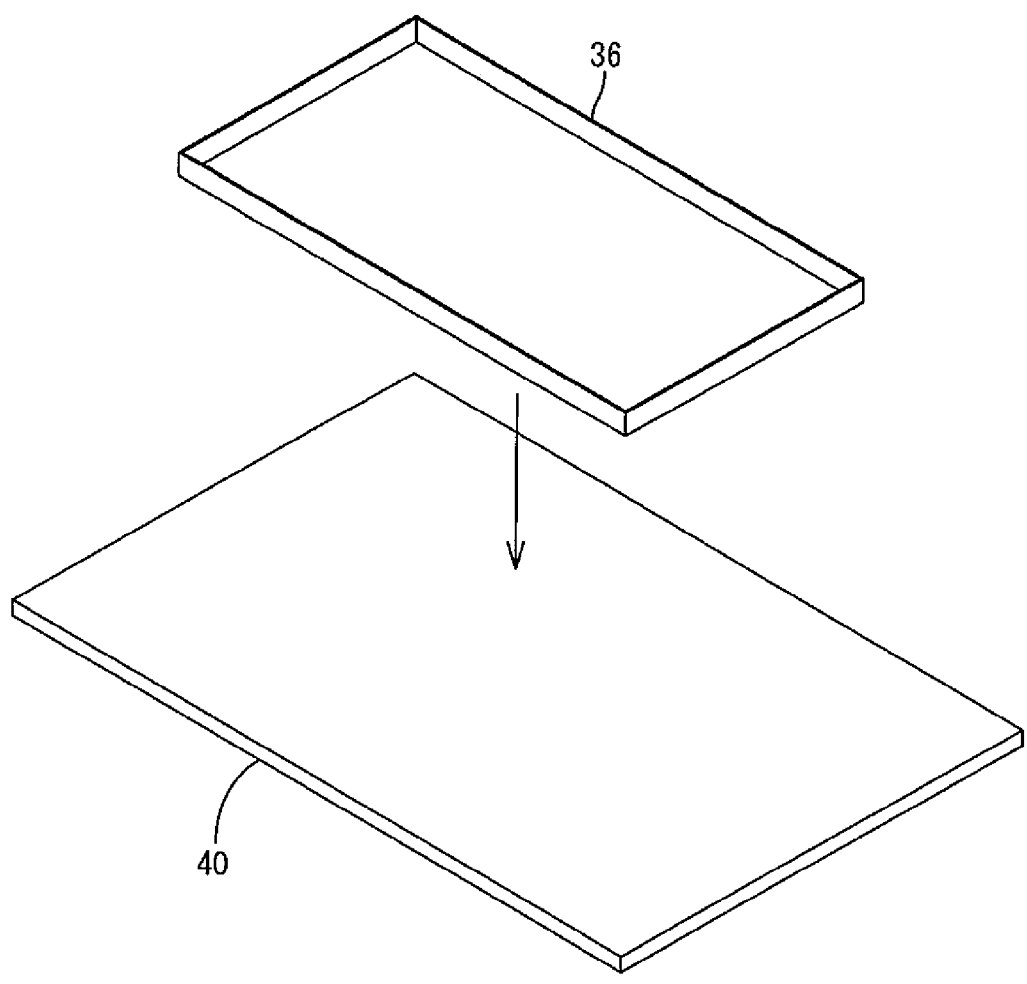
FIG. 2 is a perspective view of a base material before a die-cutting process is performed.
Figure 3:
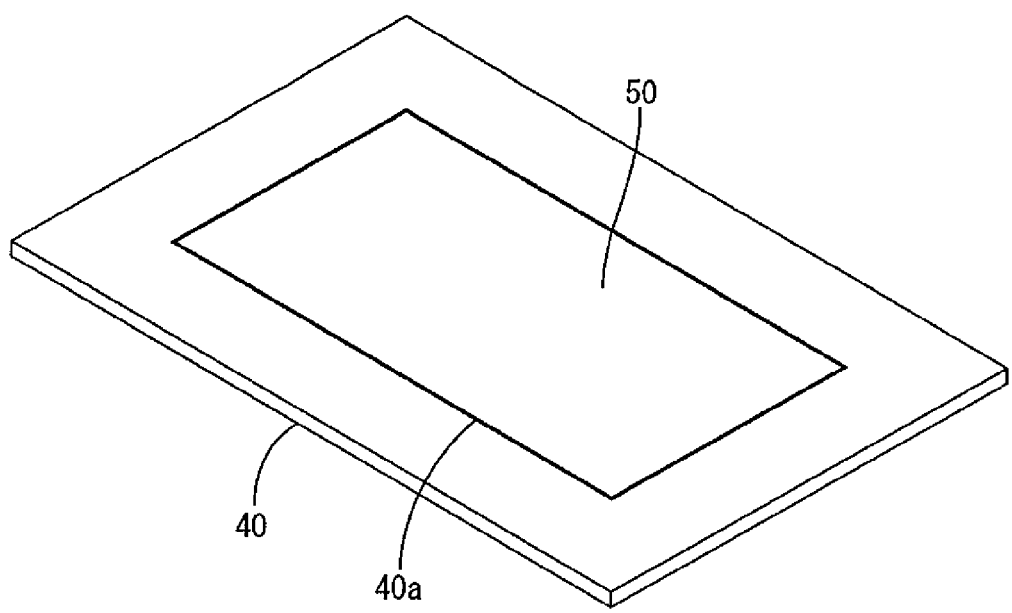
FIG. 3 is a perspective view of the base material after the die-cutting process is performed.

The method of manufacturing the light guide plate 20 will be described with reference to FIGS. 2 to 6. In the method according to this embodiment, a light guide plate base material 40 is prepared. The base material 40 is made of a material same as the light guide plate 20 (i.e., synthetic resin). The material of the light guide plate 20 and the base material 40 is polycarbonate in this embodiment. A die-cut processing is performed in which a blanking die 36 having a rectangular frame shape is moved in an up-down direction (the Z-axis direction) toward the heated base material 40 to press the base material 40, as illustrated in FIG. 2. Accordingly, as illustrated in FIG. 3, a die-cut plate 50 is formed from the base material 40 (an example of a die-cutting step). The die-cut plate 50 has a shape (a rectangular shape) along a die-cut line 40a made by the blanking die 36. The die-cut plate 50 after the blanking includes side surfaces that are perpendicular to plate surfaces of the die-cut plate 50. Each of the side surfaces has a rectangular shape. The blanking die 36 may be a cutting blade or a cutting punch.

Next, the die-cut plate 50 is set on a work table (not illustrated) and a secondary processing is performed on a side surface 52a that is one of the side surfaces 52 of the die-cut plate 50 (hereinafter, referred to as a working side surface 52a). The one of the side surfaces 52 is a light entering surface 20a of the light guide plate 20 after the manufacturing process. In the secondary processing of the die-cut plate 50, the processing surface 60a of the heated processing board 60 is pressed parallel to the rectangular working side surface 52a of the die-cut plate 50. Thus, the pattern of the processing surface 60a is thermally imprinted on the working side surface 52a (an example of a thermal-imprinting step).

Figure 4:
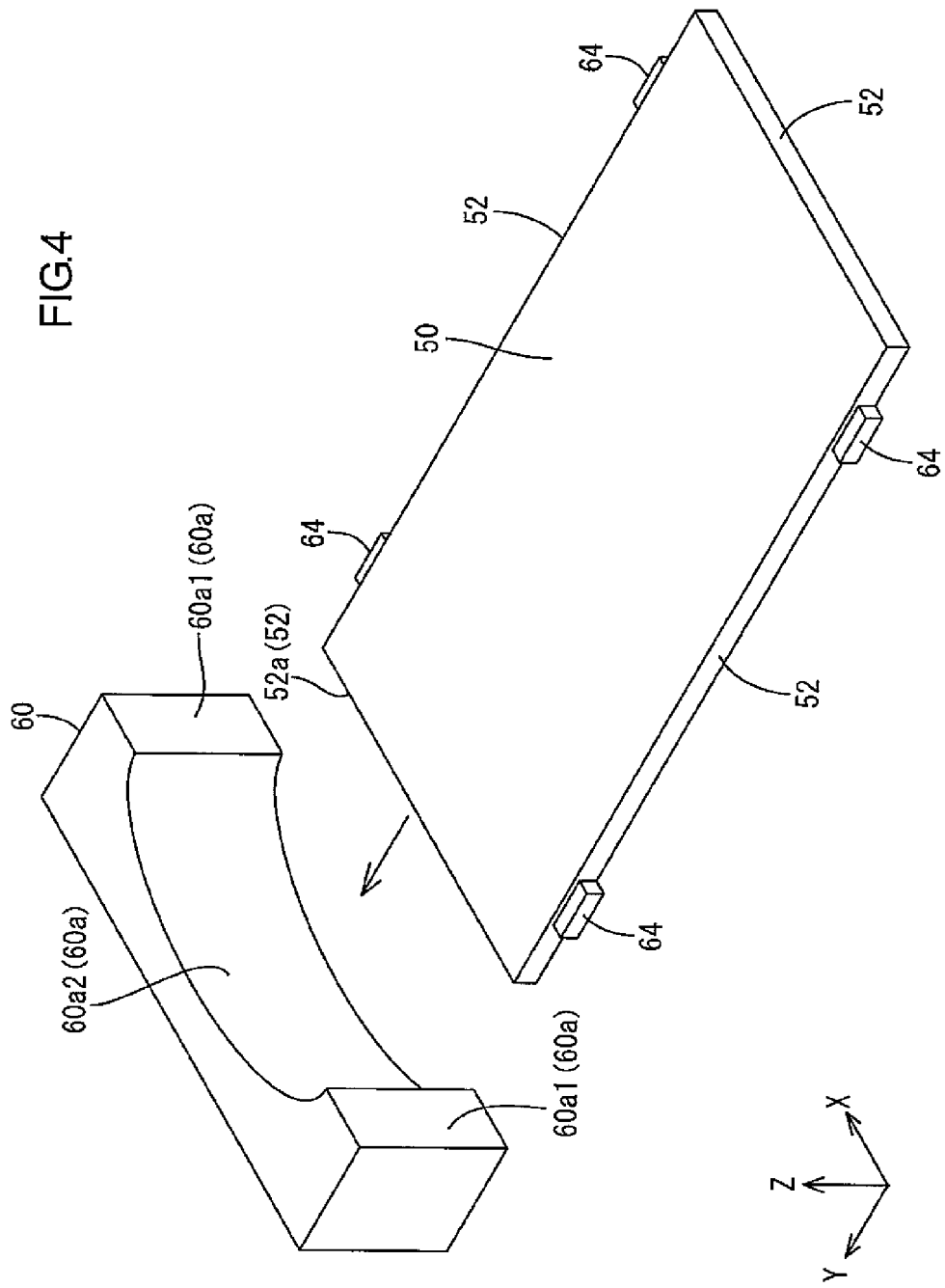
FIG. 4 is a perspective view of a die-cut plate before a thermal-imprinting process is performed.
Figure 5:
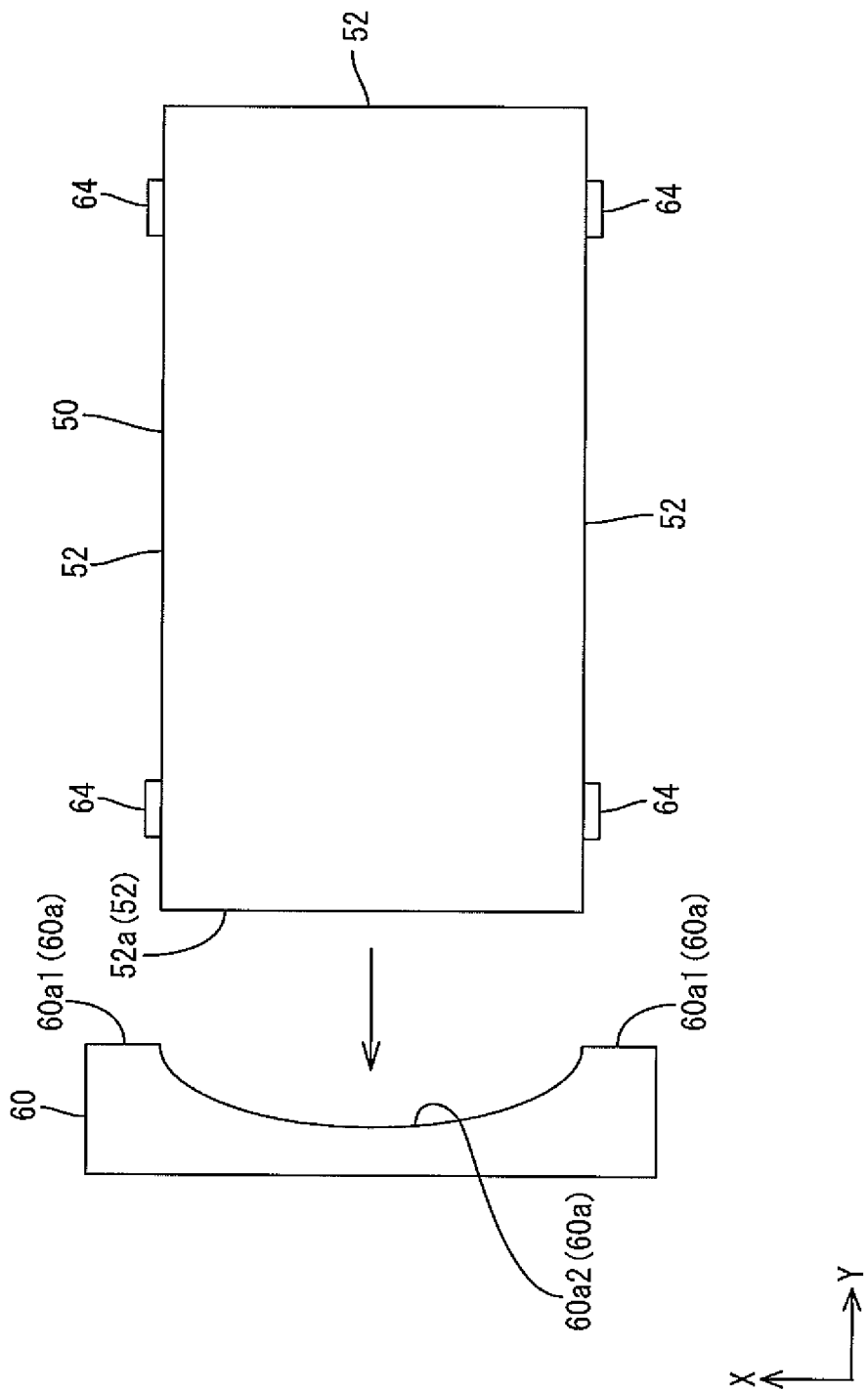
FIG. 5 is a plan view of the die-cut plate before the thermal-imprinting process is performed.

Configurations of the processing surface 60a of the processing board 60 used in the secondary processing of the die-cut plate 50 will be described. The processing surface 60a of the processing board 60 includes a processing portion 60a2 that is a portion of the processing surface 60a except for end portions 60a1 (i.e., a middle portion). The processing surface 60a is opposed to the working side surface 52a. A certain process has been performed on the processing portion 60a2. As illustrated in FIGS. 4 and 5, the processing portion 60a has a shape that is recessed more at a portion thereof opposite a middle of a long dimension (the X-axis dimension) of the working side surface 52a than a portion thereof opposite each end of the long dimension of the working side surface 52a. That is, the processing portion 60a2 has a curved surface having an arc-like shape as a whole. The processing surface 60a of the processing board 60 is a smooth surface formed by mirror finishing.

In the secondary processing performed on the die-cut plate 50, the die-cut plate 50 is moved toward the processing board 60 and then the working side surface 52a of the die-cut plate 50 is pressed against the processing surface 60a of the processing board 60. As illustrated in FIG. 4, holders 64 hold two side surfaces 52 that are adjacent to the working side surface 52a. Accordingly, while the die-cut plate 50 is being moved, the position of the die-cut plate 50 is less likely to be displaced in a direction (the X-axis direction) perpendicular to a direction in which the die-cut plate 50 is moved (the Y-axis direction).

In the secondary processing of the die-cut plate 50, when the die-cut plate 50 reaches the heated processing board 60, the working side surface 52a is shaped following the shape of the processing portion 60a2 of the processing board 60 and a pattern of the processing portion 60a2 of the processing board 60 is imprinted on the working side surface 52a. Specifically, when the die-cut plate 50 reaches the processing board 60, the pattern of the processing portion 60a2 that is the smooth surface formed by mirror finishing is thermally imprinted on the working side surface 52a and thus the working side surface 52a becomes a smooth surface.

More specifically, since the processing portion 60a2 of the processing board 60 has the arc-like shape, when the die-cut plate 50 reaches the processing board 60, the ends of the long dimension (the X-axis dimension) of the working side surface 52a come in contact with the processing board 60 before the middle portion of the long dimension (the X-axis dimension) of the working side surface 52a comes in contact. The die-cut plate 50 is gradually and sequentially pressed by the processing board 60 from the ends of the long dimension of the working side surface 52a toward the middle portion along the shape of the processing portion 60a2. That is, an entire surface of the working side surface 52a is not simultaneously pressed by the processing board 60 but gradually and sequentially pressed by the processing board 60 from the ends of the working side surface 52a. Accordingly, in shaping the working side surface 52a, portions of the working side surface 52a pressed by the processing board 60 are pushed from the ends of the working side surface 52a toward the middle portion. According to this configuration, the working side surface 52a pressed by the processing board 60 does not or is less likely to protrude from the ends of the working side surface 52a during shaping of the working side surface 52a. Namely, burrs are not created or less likely to be created.

In the secondary processing performed on the die-cut plate 50 of this embodiment, the processing board 60 that is heated to a temperature in a range from 150° C. to 180° C. is pressed against the working side surface 52a. Further, the processing board 60 is pressed against the working side surface 52a by applying a load in a range from 200 gf (gram force) to 1500 gf. The pressing time to press the processing board 60 to the working side surface 52a is in a range from 10 seconds to 200 seconds.

Figure 6:
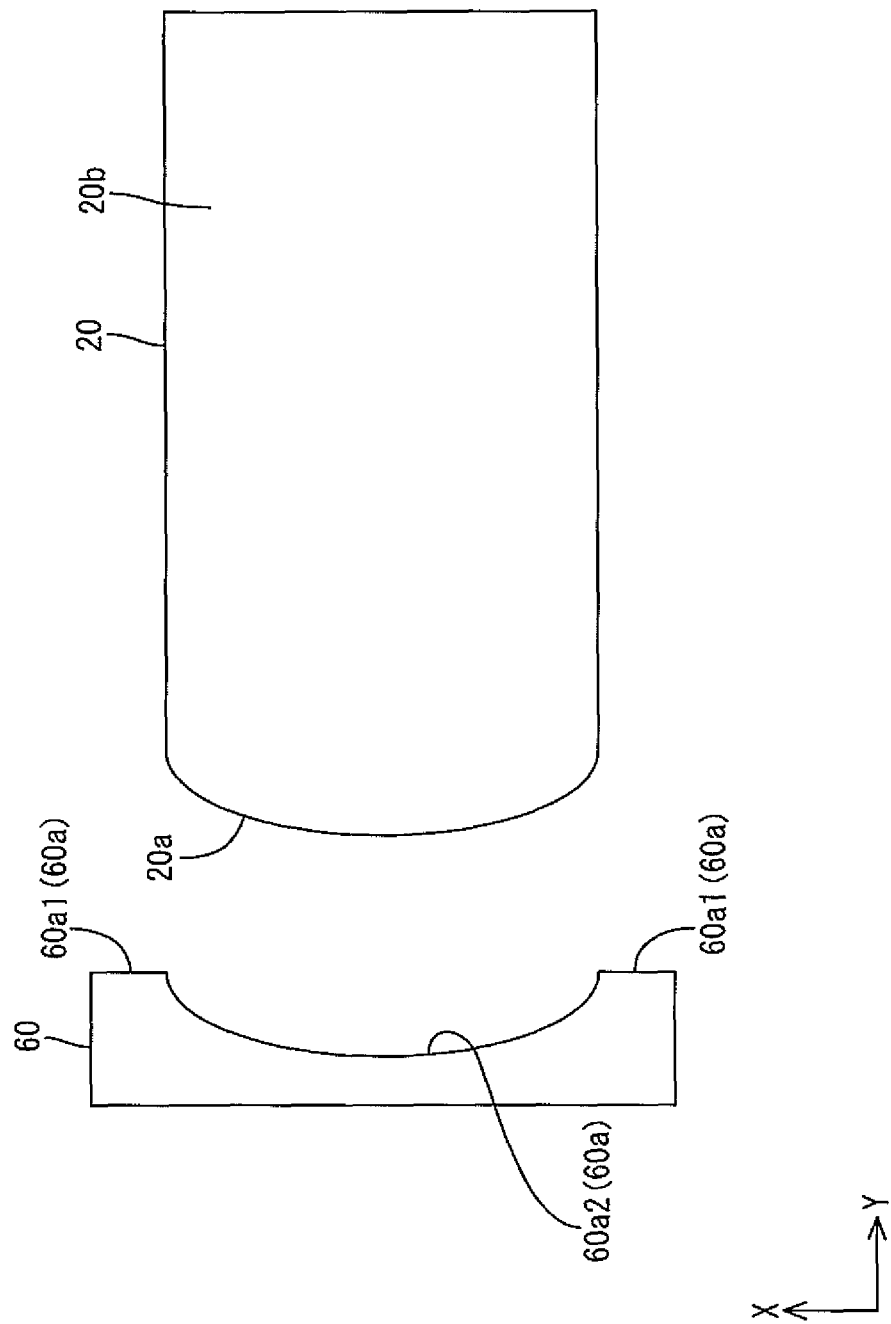
FIG. 6 is a plan view of the die-cut plate after the thermal-imprinting process is performed.

As described earlier, the working side surface 52a is shaped along the arc-like shape of the processing portion 60a2 of the processing board 60, that is, the working side surface 52a of the die-cut plate 50 is shaped into an arc-like shape following the shape of the processing portion 60a2, as illustrated in FIG. 6. Accordingly, in the secondary processing of the die-cut plate 50 in this embodiment, thermal-imprinting and shaping of the working side surface 52a of the die-cut plate 50 are carried out at the same time. Through the processes described above, the light guide plate 20 according to this embodiment is manufactured.

Figure 7:
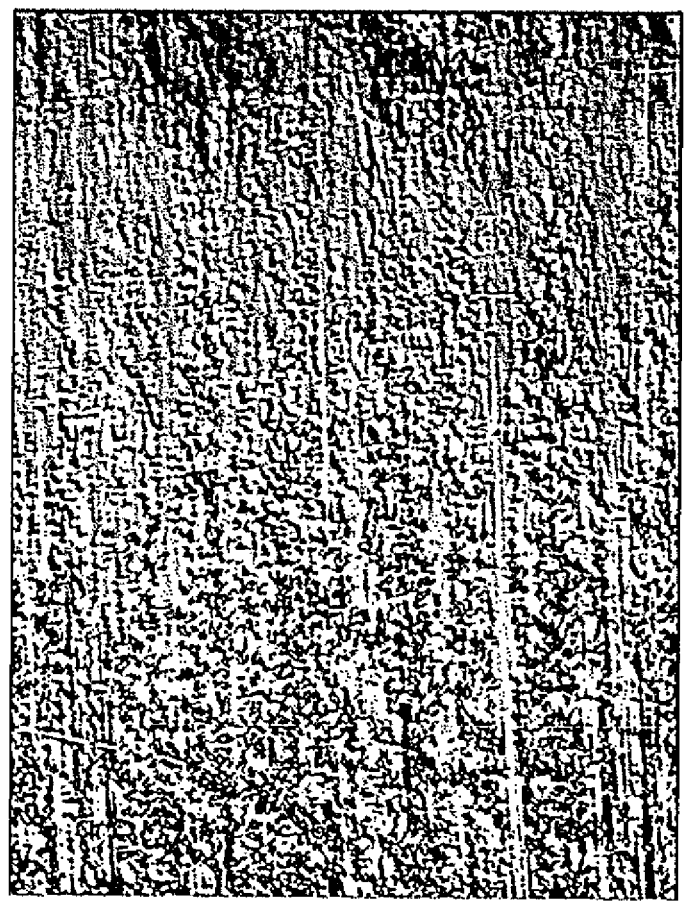
FIG. 7 is a photograph of a magnified side surface of the die-cut plate before a processing board is pressed.
Figure 8:
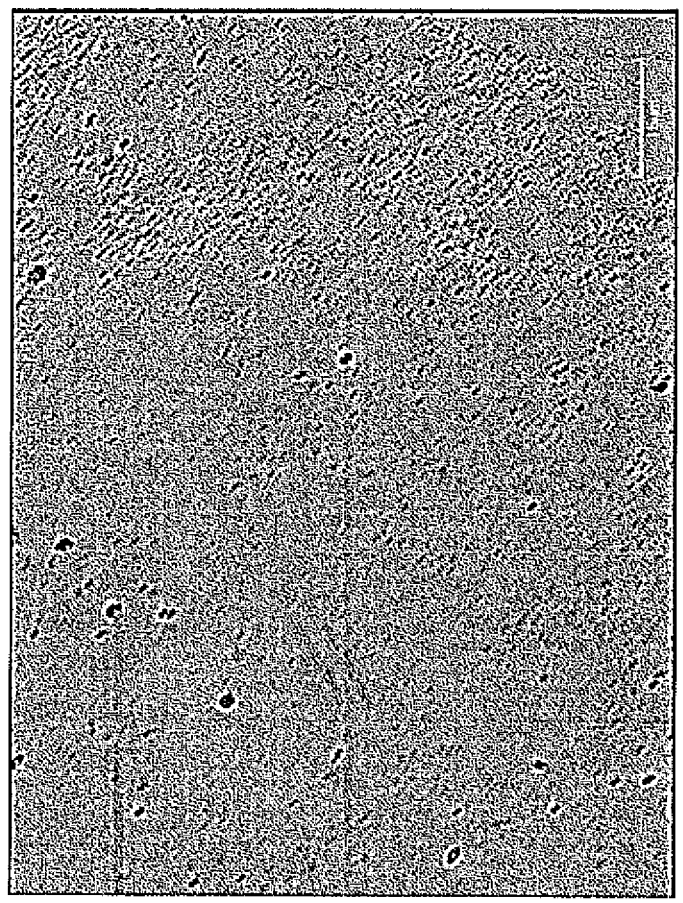
FIG. 8 is a photograph of a magnified side surface of the die-cut plate after the processing board is pressed.

FIG. 7 is a photograph of a magnified side surface of the die-cut plate 50 before the processing board 60 is pressed against the die-cut plate 50. FIG. 8 is a photograph of a magnified side surface 52 of the die-cut plate 50 after the processing board 60 is pressed against the die-cut plate 50. As illustrated in FIG. 7, the side surface 52 of the die-cut plate 50 that is cut off from the base material 40 has a high surface roughness and its arithmetic average surface roughness (Ra) is 0.24. Under such a surface roughness, efficiency of light that enters through the side surface 52 is low. In contrast, the die-cut plate 50 of this embodiment that is cut off from the base material 40 is pressed by the processing board 60 in the secondary processing. Thus, as depicted in FIG. 8, the surface roughness is improved compared to the one in FIG. 7 and its arithmetic average surface roughness (Ra) is 0.04. Under such a surface roughness, efficiency of light that enters through the working side surface 52a is improved. Specifically, assuming that efficiency of light entering through the working side surface 52a is 100% and brightness at the working side surface 52a is 100% under the condition in FIG. 7, efficiency of light entering through the working side surface 52 is 105% and brightness at the working side surface 52a is 110% under the condition in FIG. 8.

The LEDs 28 are mounted opposite the light entering surface 20a of the light guide plate 20 manufactured by the above method (an example of a light source attaching step) and other components that constitute the backlight unit 24 are further mounted. Accordingly, the backlight unit 24 of this embodiment is manufactured. The liquid crystal panel 11 is mounted to the backlight unit 24 (an example of a display panel mounting step) and then the cover panel 12 and the casing 34 are mounted to the backlight unit 24. Accordingly, the liquid crystal display device 10 of this embodiment is manufactured.

As described above, the method of manufacturing the light guide plate according to this embodiment includes the thermal-imprinting process in which the processing surface 60a of the processing board 60 is pressed against at least one of the side surfaces 52 of the die-cut plate 50 that is formed by die-cutting the light guide plate base material 40. The light guide plate 20 manufactured by the method has the side surface 52 having improved surface accuracy and an improved light entering property. If the processing surface of the processing board is flat and the processing surface is pressed against the side surface of the die-cut plate, a middle portion of the long dimension of the side surface is pressed and pushed toward the ends of the long dimension of the side surface. Thus, the side surface protrudes over the ends of the side surface. That is, burrs may be created at the ends of the long dimension of the side surface. In contrast, in the method of manufacturing the light guide plate 20 according to this embodiment, the processing surface 60a pressed against the side surface 52 of the die-cut plate 50 in the thermal-imprinting process has the shape that is recessed more at the portion thereof opposite the middle of the long dimension (the X-axis dimension) of the side surface 52. That is, the die-cut plate 50 is gradually pressed by the processing surface 60a from the ends of the long dimension of the side surface 52 toward the middle. Thus, burrs are not or less likely to be created at the ends of the side surface 52. As described above, in the method of manufacturing the light guide plate 20 according to this embodiment, the light guide plate 20 having an improved light entering property at the side surface 52 is manufactured with less or no burrs at the ends of the side surface 52.

In the thermal-imprinting process in the method of manufacturing the light guide plate 20, the processing board 60 is pressed against one of the side surfaces of the die-cut plate 50 that is to be disposed opposite the LEDs 28, namely, against one of the side surfaces 52 configured as the light entering surface 20a. The light guide plate 20 manufactured by the method has a side surface to be disposed opposite the LEDs 28 having improved surface accuracy. This effectively improves brightness of the backlight unit 24 that includes the light guide plate 20.

In the thermal-imprinting step in the method of manufacturing the light guide plate 20, the processing surface of the processing board 60 that is a smooth surface formed by mirror finishing is pressed against the side surface 52. According to the manufacturing method, entrance efficiency of light entering through the side surface 52 is improved by pressing the processing surface 60a that is a smooth surface by mirror finishing against the side surface 52. This effectively improves brightness of the backlight unit 24 including the light guide plate 20.

In the method of manufacturing the light guide plate 20, in the thermal-imprinting process, the processing board 60 is pressed against the side surface 52 while the holders 64 hold the die-cut plate 50 with respect to the long-side dimension of the side surface 52. According to the manufacturing method, the die-cut plate 50 is not or less likely to be displaced in the long-side dimension of the side surface 52. Thus, the side surface 52 of the die-cut plate 50 is appropriately processed.

First Modification of the First Embodiment

A first modification of the first embodiment will be described. In the method of manufacturing a light guide plate according to the first modification, a processing surface of a processing board pressed against a processing side surface of a die-cut plate is a rough surface. In a configuration that the light guide plate is disposed opposite the LEDs arranged in line, uneven brightness may occur. Specifically, in a region of the light guide plate close to a light entering surface, portions of the region opposite spaces between the LEDs are relatively darker than portions of the region opposite the LEDs. The processing surface of this modification has a pattern whose roughness is adjusted. By thermally imprinting the adjusted pattern on a working side surface of the die-cut plate, light entering properties of the working side surface improves. Accordingly, uneven brightness does not or is less likely to occur in the manufactured light guide plate.

Second Modification of the First Embodiment

A second modification of the first embodiment will be described. In the method of manufacturing a light guide plate according to the second modification, a processing surface of a processing board is pressed against all of side surfaces of a die-cut plate. By thermally imprinting a pattern of a processing board on all of the side surfaces of the die-cut plate, brightness of a backlight unit including the manufactured light guide plate improves compared to a configuration in which the processing surface is pressed against only a side surface of a die-cut plate configured as a light entering surface.

Second Embodiment

Figure 9:
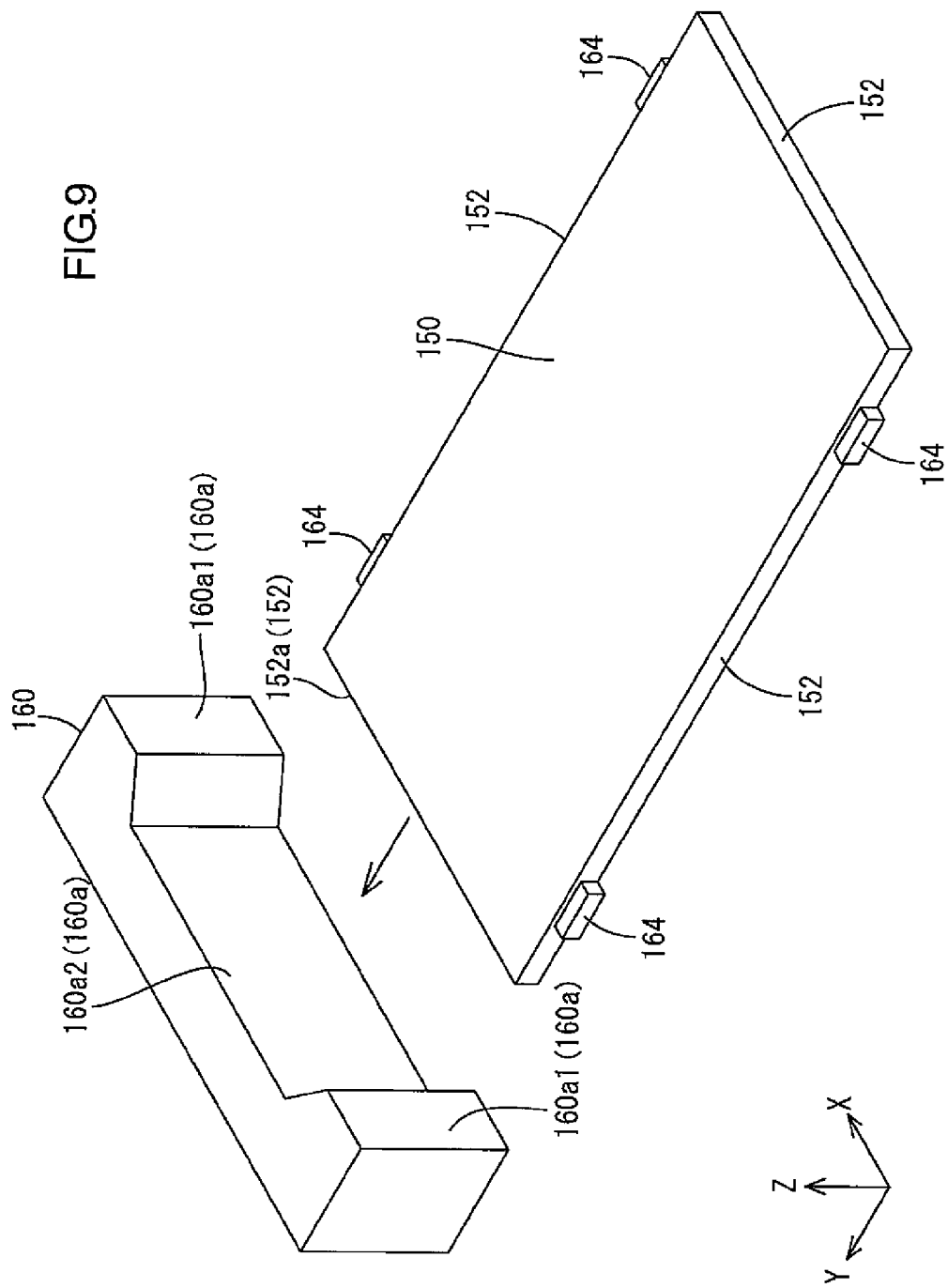
FIG. 9 is a perspective view of a die-cut plate according to a second embodiment before a thermal-imprinting process is performed.
Figure 10:
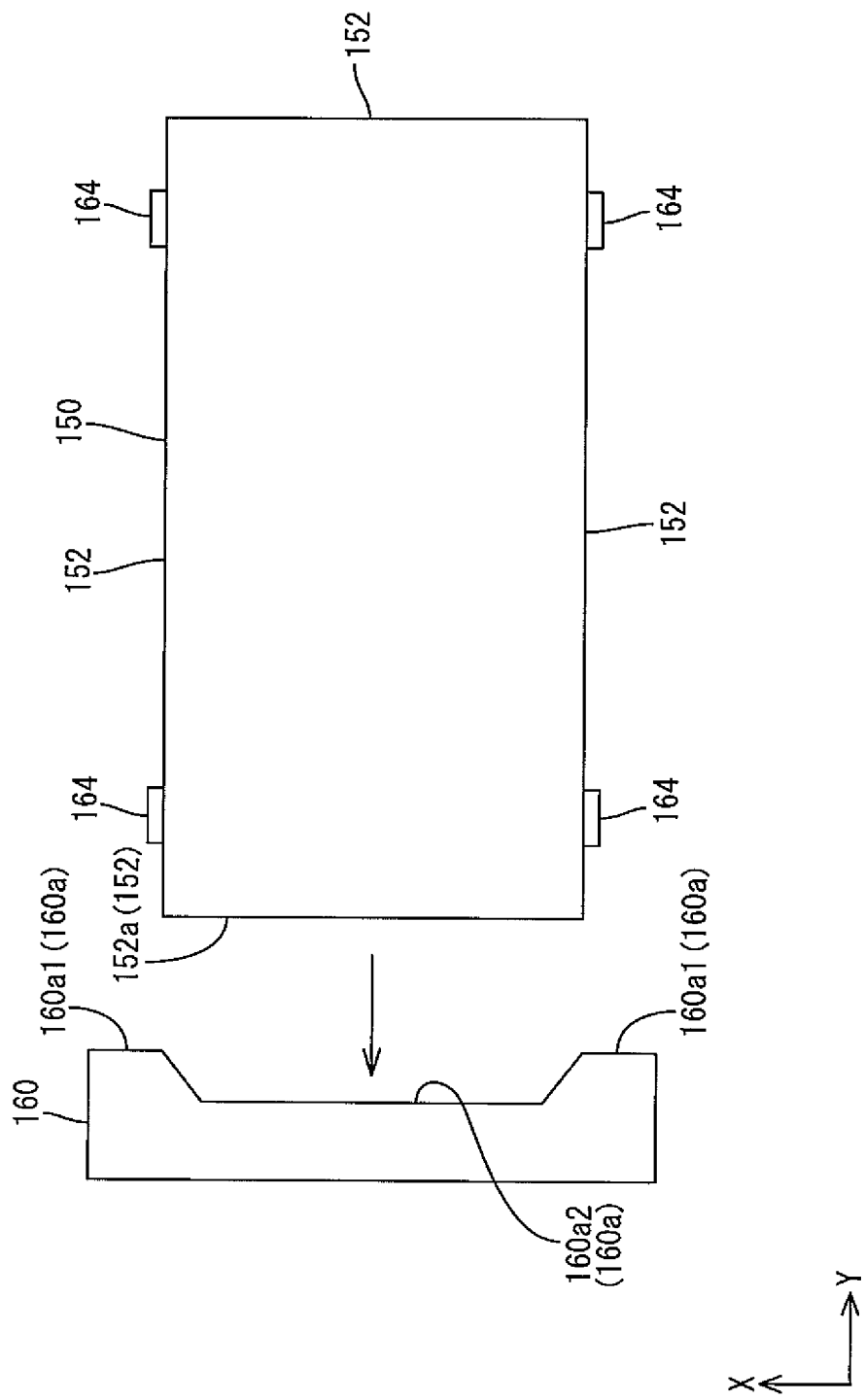
FIG. 10 is a plan view of the die-cut plate according to the second embodiment before the thermal-imprinting process is performed.
Figure 11:
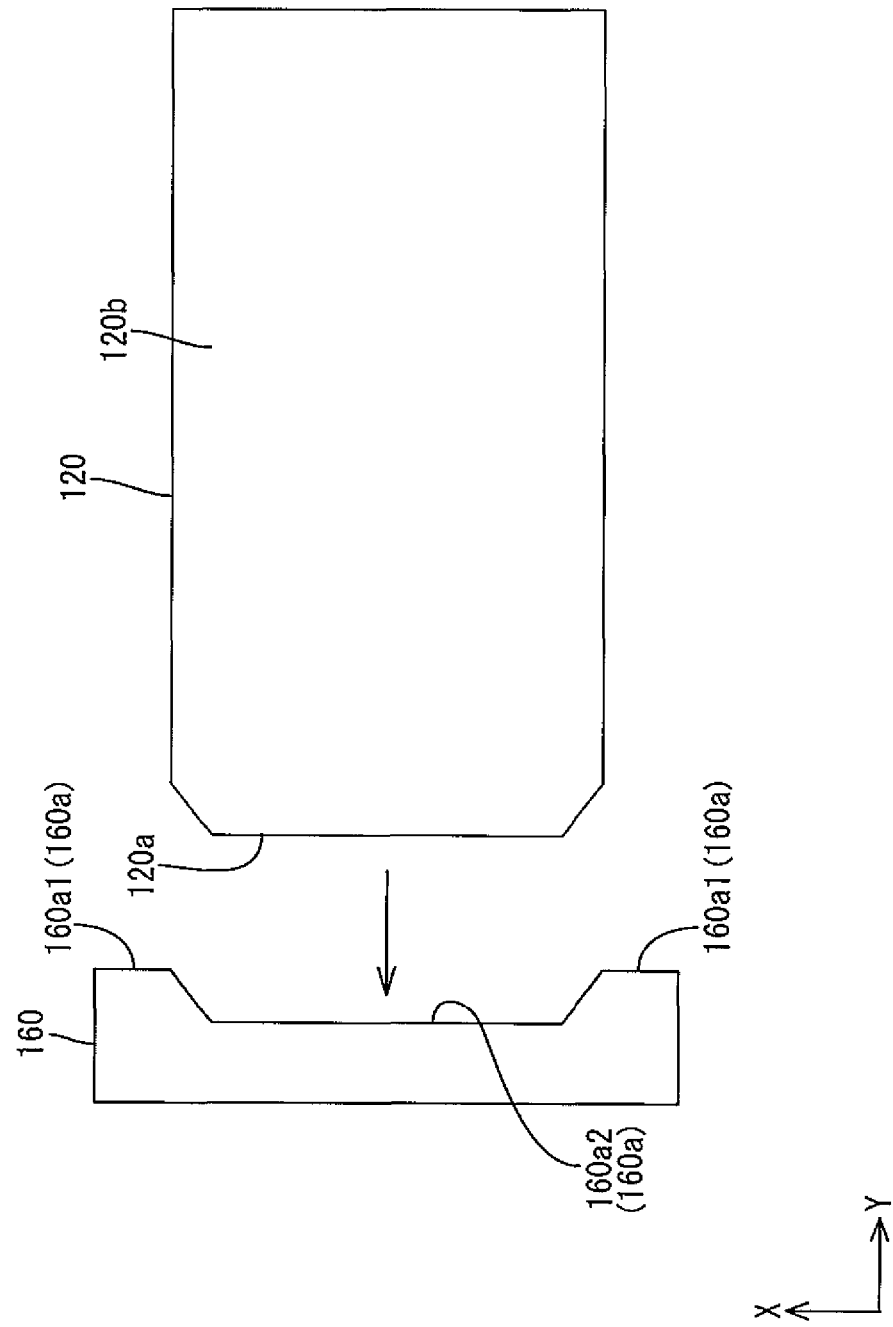
FIG. 11 is a plan view of the die-cut plate according to the second embodiment after the thermal-imprinting process is performed.
Figure 12:
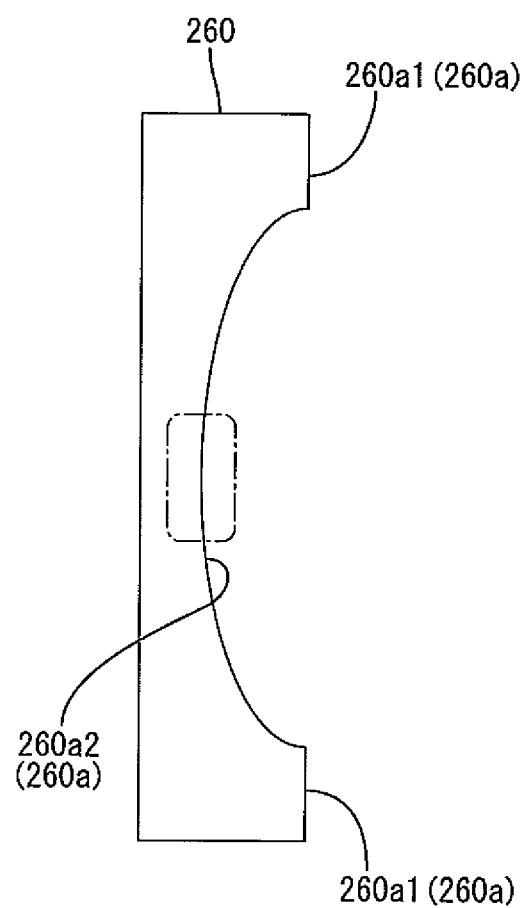
FIG. 12 is a plan view of a processing board according to a third embodiment.
Figure 13:
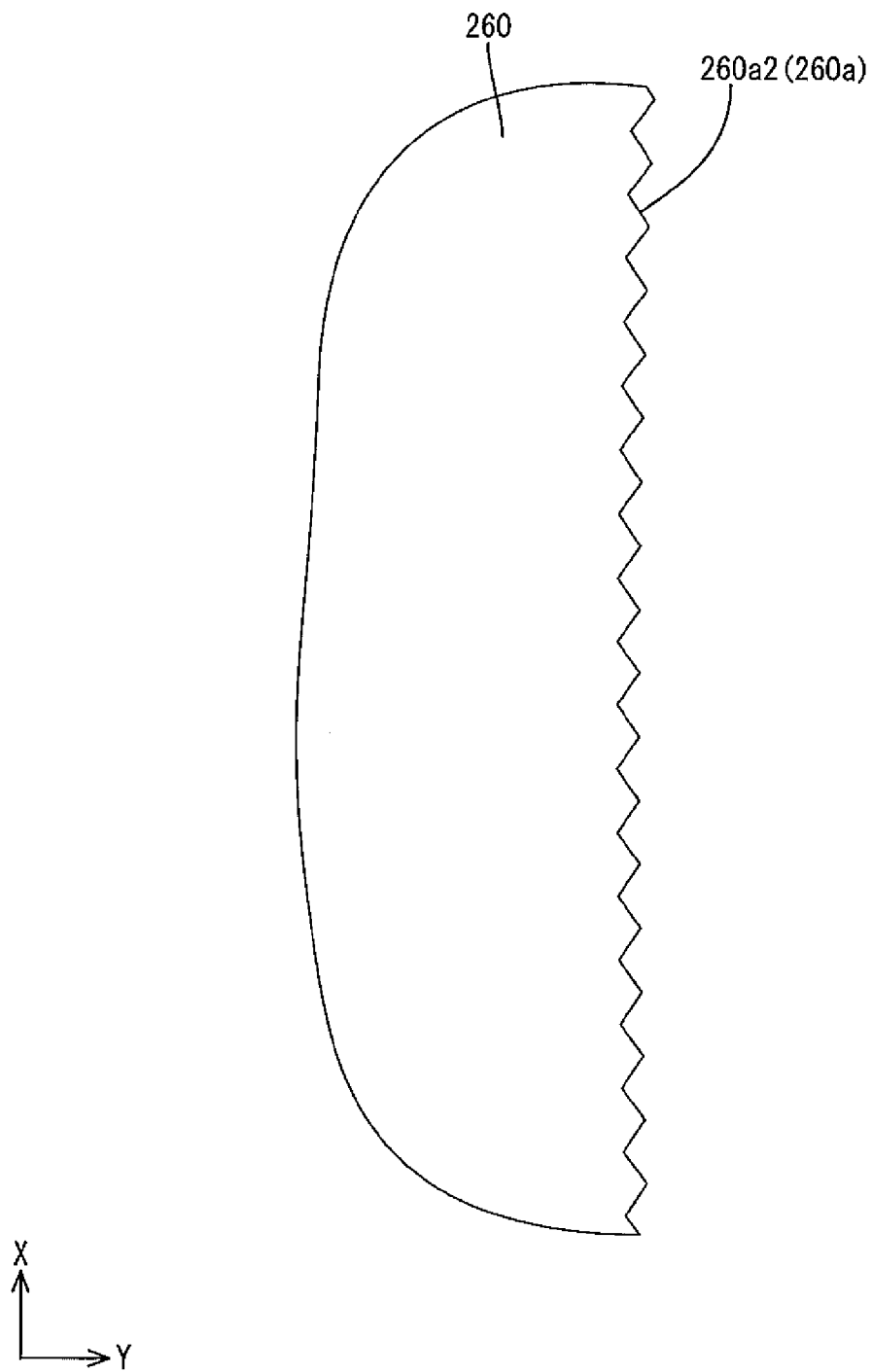
FIG. 13 is a magnified plan view of a portion encircled by chain line in FIG. 12.

A second embodiment will be described with reference to FIGS. 9 to 11. A processing surface 160a of a processing board 160 according to the second embodiment is different from the one in the first embodiment. Other configurations are similar to the first embodiment and thus similar configurations, operations, and effects to the first embodiment will not be described. In FIGS. 9, 10 and 11, portions indicated by numerals including the reference numerals in FIGS. 4, 5, and 6 with 100 added thereto have the same configurations as the portions indicated by the respective reference numerals in the first embodiment.

As illustrated in FIG. 9, in a method of manufacturing a light guide plate 120 according to this embodiment, the processing board 160 including the processing surface 160a that has a different shape from the one in the first embodiment is pressed against a working side surface 152a of a die-cut plate 150. Similar to the first embodiment, the processing surface 160a of the processing board 160 includes a processing portion 160a2 that is a portion of the processing surface 160a (i.e., a middle portion) except for end portions 160a1. A certain work has been performed on the processing portion 160a2. As illustrated in FIGS. 9 and 10, the processing portion 160a2 includes flat surfaces that form a trapezoidal recess as a whole. Specifically, the processing portion 160a2 has a shape that is recessed more at a portion thereof opposite a middle of a long dimension (the X-axis dimension) of the working side surface 52a than portions thereof opposite ends of the long dimension (in the X-axis direction) of the working side surface 152a. The working side surface 152a is shaped following the shape of the trapezoidal processing portion 160a2 of the processing board 160. As a result, as illustrated in FIG. 11, the working side surface 152a of the die-cut plate 150 is shaped into a trapezoidal shape that matches the shape of the processing portion 160a2.

Even with the processing surface 160a of the processing board 160 having the shape as described above, a portion of the working side surface 152a that is pressed by the processing board 160 is pushed toward the middle of the working side surface 52a from the ends of the working side surface 152a during shaping of the working surface 152a. Thus, the working side surface 152a pressed by the processing board 160 does not or is less likely to protrude from the ends of the working side surface 152a. Namely, burrs are not or less likely to be created during shaping the working side surface 152a.

Third Embodiment

A third embodiment will be described with reference to FIGS. 12 to 15. A processing surface 260a of a processing board 260 according to the third embodiment is a micro-fabricated surface, which is different from the one in the first embodiment. Other configurations are similar to the first embodiment and thus similar configurations, operations, and effects to the first embodiment will not be described.

In a method of manufacturing a light guide plate according to the third embodiment, a secondary processing is performed on a die-cut plate in which the micro-fabricated processing surface 260a of the processing board 260 is pressed against the die-cut plate. An overall shape of the processing surface 260a of the processing board 260 is similar to the one in the first embodiment (an arc-like shape). However, a wavy pattern having straight lines is micro-fabricated on a processing portion 260a2 of the processing surface 260a as shows in FIG. 13, which shows a magnified view of a part of the processing portion 260a2 (a portion encircled by chain line in FIG. 12). Such a micro-fabricated wavy pattern may come from a micro-fabricated prism pattern, a micro-fabricated cylindrical pattern, a micro-fabricated pyramid pattern. By adjusting the micro-fabricated pattern of this embodiment and by thermally imprinting such an adjusted pattern on the working side surface of the die-cut plate, properties of light entering through the side surface are improved. Accordingly, uneven brightness as described in the first modification of the first embodiment does not or is less likely to occur in the manufactured light guide plate.

Figure 14:
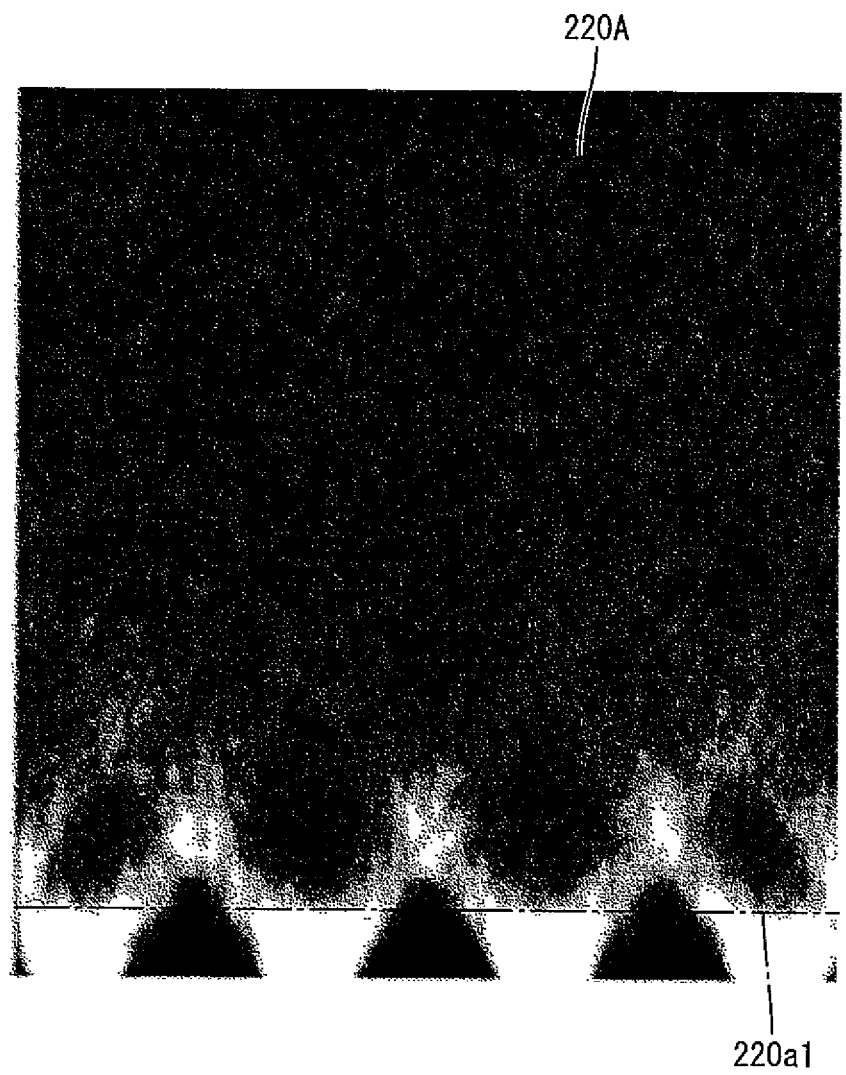
FIG. 14 is a magnified photograph of a light guide plate that is manufactured without performing a secondary processing on a die-cut plate. The photograph shows how light from LEDs enters the light guide plate through a light entering surface.
Figure 15:
FIG. 15 is a magnified photograph of a light guide plate that is manufactured through performing a secondary working on a die-cut plate according to the third embodiment. The photograph shows how light from LEDs enters the light guide plate through a light entering surface.

FIG. 14 is a magnified photograph of a light guide plate 220A that is manufactured without performing the secondary processing on a die-cut plate 250. The photograph shows the light guide plate 220A and light from LEDs entering through a light entering surface 220a1. FIG. 15 is a magnified photograph of a light guide plate 220B that is manufactured by performing the secondary processing on die-cut plate 250 according to this embodiment. The photograph shows the light guide plate 250B and light from LEDs entering through a light entering surface 220a2. As illustrated in FIG. 14, the light guide plate 220A manufactured without performing the secondary processing on the die-cut plate 250 may cause uneven brightness. Specifically, in a region of the light guide plate close to the light entering surface 220a1, portions of the region opposite spaces between the LEDs are relatively darker than portions of the region opposite the LEDs. In contrast, the light guide plate 220B of this embodiment is manufactured by pressing the micro-fabricated processing surface 260a of the processing board 260 against a working surface of a die-cut plate. Thus, in comparison to the case shown in FIG. 14, uneven brightness is significantly reduced in the region of the light guide plate 220B near the light entering surface 220a, as shown in FIG. 15.

Modification of the Third Embodiment

Figure 16:
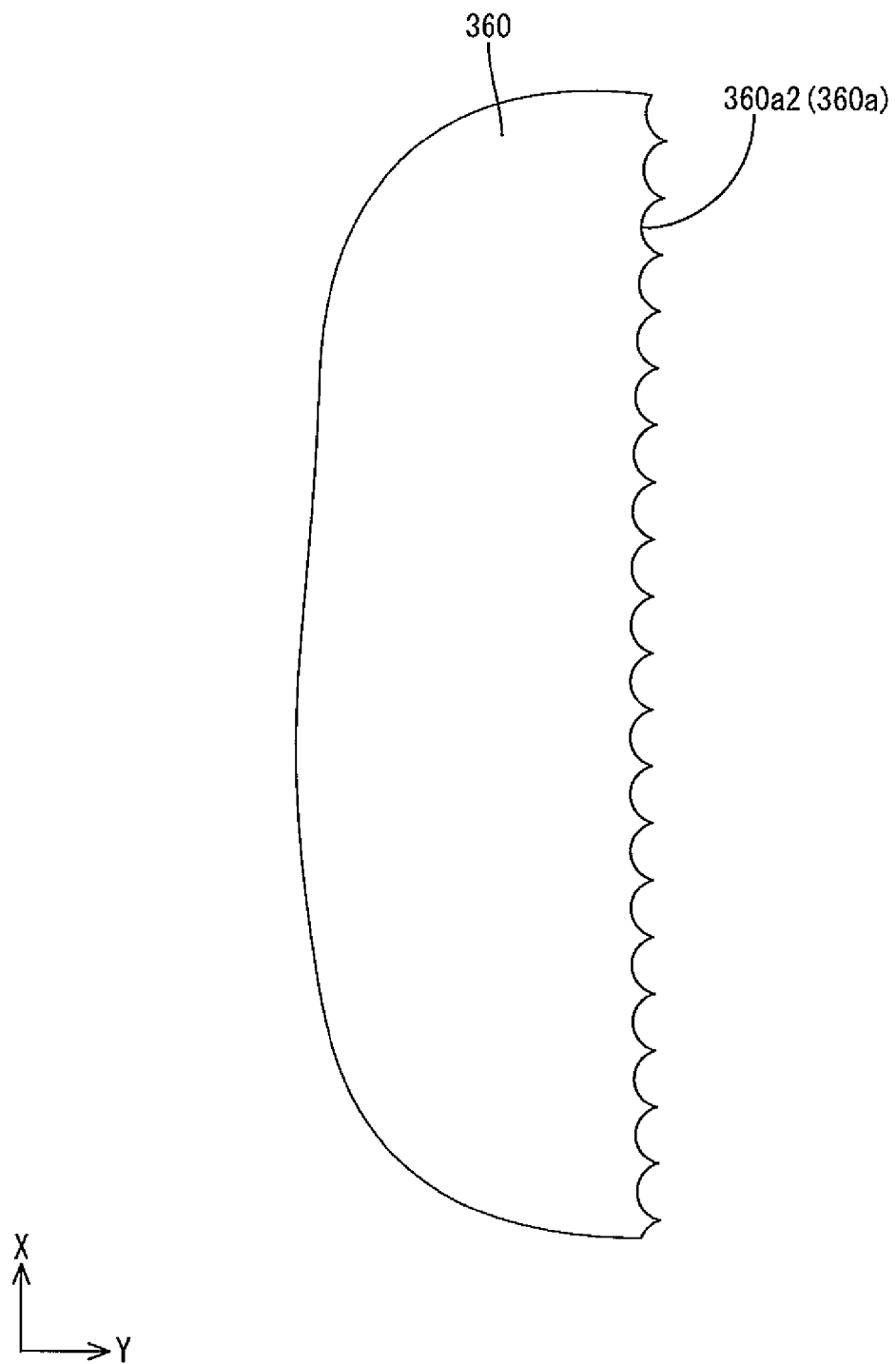
FIG. 16 is a magnified plan view of a portion of a processing surface of a processing board according to a modification of the third embodiment.

A modification of the third embodiment will be described. In the method of manufacturing a light guide plate according to this modification, a secondary processing is performed in which a processing surface 360a of a processing board having a different micro-fabricated pattern from the one in the third embodiment is pressed against a working side surface of a die-cut plate. As illustrated in FIG. 16, a wavy pattern having curved lines is micro-fabricated on a processing portion 360a2 of the processing surface 360a of the processing board 360. Even with the micro-fabricated pattern of the processing surface 360a having such a shape, by adjusting the micro-fabricated pattern and by thermally imprinting such an adjusted pattern on the working side surface of the die-cut plate, the properties of light entering through the working surface are improved. Accordingly, uneven brightness as described in the first modification of the first embodiment does not or is less likely to occur in the manufactured light guide plate.

Other Embodiments

The present invention is not limited to the embodiments described above and illustrated by the drawings. For examples, the following embodiments will be included in the technical scope of the present invention.

(1) In each of the above embodiments, the processing portion of the processing surface having an arc-like shape or the trapezoidal shape is pressed against the die-cut plate. However, the shape of the processing portion is not limited to those shapes as long as a processing portion of a processing surface has a shape that is recessed more at a portion thereof opposite a middle of a long dimension of a working side surface included in a die-cut plate than portions thereof opposite ends of the long dimension of the working side surface.

(2) In the above embodiments, the secondary processing is performed on one of the side surfaces of the die-cut plate configured as the light entering surface or on all of the side surfaces of the die-cut plate. However, the secondary processing may be performed on two or three of the side surfaces of the die-cut plate.

(3) In each of the above embodiment, the die-cut plate is held by the holders during the secondary processing. However, how to hold the die-cut plate during the secondary processing is not limited to those in the above embodiments.

(4) In each of the above embodiments, the method of manufacturing the light guide plate used for the liquid crystal display devices classified as a small sized or a medium sized panel will be described. However, the aspect of this invention can be applied to light guide plates used for large liquid crystal modules such as television devices.

(5) Patterns to be imprinted on the side surface of the die-cut plate may be altered from those of the above embodiments.

(6) In each of the above embodiments, the method of manufacturing the light guide plate for the liquid crystal display device and the backlight unit is described. However, the aspect of this invention can be applied to light guide plates used for other types of display devices and lighting devices.

The embodiments have been described in detail. However, the above embodiments are only some examples and the scope of the claimed invention is not limited thereto. The technical scope of the claimed invention includes various modifications of the above embodiments.

The technical elements described in this specification and the drawings may be used independently or in combination to achieve the technical benefits. The combinations are not limited to those in original claims. With the technologies described in this specification and the drawings, multiple objects may be accomplished at the same time. However, the technical benefits can be achieved by accomplishing even only one of the objects.

EXPLANATION OF SYMBOLS

10: liquid crystal display device, 11: liquid crystal panel, 12: cover panel, 18: optical sheets, 20, 120, 220A, 220B: light guide plate, 20a, 120a, 220a1, 220a2: light entering surface, 22: frame, 24: backlight unit, 34: casing, 36: blanking die, 40: base material, 50, 150: die-cut plate, 52, 152: side surface (of the die-cut plate), 52a, 152a: working side surface, 60, 160, 260: processing board, 60a, 160a, 260a: processing surface, 60a2, 160a2, 260a2: processing portion, 64, 164: holder.

The invention claimed is:

1. A method of manufacturing a light guide plate, the method comprising:
cutting a light guide plate base material with a die having a frame shape into a die-cut plate including side surfaces each having a rectangular shape including a long dimension; and
performing a thermal-imprinting process to press a processing surface of a plate surface of a heated processing board against one of the side surfaces of the die-cut plate by sequentially increasing a load from ends of the long dimension of the one of the side surfaces toward a middle portion of the long dimension of the one of the side surfaces along the processing surface of the processing board to thermally imprint a pattern corresponding to a shape of the processing surface of the heated processing board to the one of the side surfaces of the die-cut plate, wherein in the thermal-imprinting process, the shape of the processing surface is recessed more at a portion thereof to be opposite a middle of the long dimension of the one of the side surfaces than a portion thereof to be opposite ends of the long dimension of the one of the side surfaces is pressed against the one of the side surfaces.

2. The method of manufacturing a light guide plate according to claim 1, wherein in the thermal-imprinting process, the processing board is pressed against the one of the side surfaces of the die-cut plate to be opposite a light source among the side surfaces of the die-cut plate.

3. The method of manufacturing a light guide plate according to claim 1, wherein in the thermal-imprinting process, the processing board is pressed against all of the side surfaces of the die-cut plate.

4. The method of manufacturing a light guide plate according to claim 1, wherein in the thermal-imprinting process, the processing board including the processing surface that is a smooth surface formed by mirror finishing is pressed against the one of the side surfaces.

5. The method of manufacturing a light guide plate according to claim 1, wherein in the thermal-imprinting process, the processing board including the processing surface that is a rough surface is pressed against the one of the side surfaces.

6. The method of manufacturing a light guide plate according to claim 1, wherein in the thermal-imprinting process, the pattern of the processing surface is a micro-fabricated pattern and the processing board including the micro-fabricated pattern is pressed against the one of the side surfaces.

7. The method of manufacturing a light guide plate according to claim 6, wherein in the thermal-imprinting process, the micro-fabricated pattern of the processing surface is a wavy pattern along the long dimension of the one of the side surfaces and the processing board including the wavy pattern is pressed against the one of the side surfaces.

8. The method of manufacturing a light guide plate according to claim 1, wherein in the thermal-imprinting process, the processing board is pressed against the one of the side surfaces while the die-cut plate is held with respect to the long dimension of one of the side surfaces.

9. A method of manufacturing a lighting device comprising steps of:

manufacturing the light guide plate by the manufacturing method according to the method according to claim 1; and disposing a light source opposite the one of the side surfaces of the light guide plate.

10. A method of manufacturing a display device comprising:

manufacturing the lighting device according to the manufacturing method of claim 9; and disposing a display panel opposite one of plate surfaces of the light guide plate perpendicular to the side surfaces.

* * * * *